(12) United States Patent
Han et al.

(10) Patent No.: US 7,709,381 B2
(45) Date of Patent: May 4, 2010

(54) SEMICONDUCTOR DEVICE FABRICATING METHOD

(75) Inventors: Jaewon Han, Soowon-si (KR); Dong Ki Jeon, Gangneung-si (KR)

(73) Assignee: Dongbu Hi Tek Co., Ltd., Seoul (KR)

( * ) Notice: Subject to any disclaimer, the term of this patent is extended or adjusted under 35 U.S.C. 154(b) by 169 days.

(21) Appl. No.: 11/986,530

(22) Filed: Nov. 20, 2007

(65) Prior Publication Data

US 2008/0160757 A1 Jul. 3, 2008

(30) Foreign Application Priority Data

Dec. 27, 2006 (KR) .................. 10-2006-0134783

(51) Int. Cl.
*H01L 21/44* (2006.01)
(52) U.S. Cl. ............... 438/667; 438/459; 257/E21.597; 257/E21.484
(58) Field of Classification Search .......... 438/667, 438/459; 257/E21.597, E21.577, E21.583, 257/E21.484
See application file for complete search history.

(56) References Cited

U.S. PATENT DOCUMENTS

| 7,282,444 | B2 | 10/2007 | Tanida et al. | |
|---|---|---|---|---|
| 2002/0048907 | A1* | 4/2002 | Miyamoto et al. | .......... 438/464 |
| 2005/0167805 | A1 | 8/2005 | Usami | |
| 2005/0173377 | A1 | 8/2005 | Pietsch et al. | |
| 2006/0116055 | A1* | 6/2006 | Oyu et al. | .................. 451/41 |
| 2007/0281473 | A1* | 12/2007 | Clark et al. | ................. 438/667 |

FOREIGN PATENT DOCUMENTS

| GB | 2400059 | * 10/2004 |
|---|---|---|
| JP | 2001162497 | * 6/2001 |
| JP | 2005-167093 | 6/2005 |
| KR | 10-0327326 | 2/2002 |
| KR | 10-2005-0014350 A | 2/2005 |
| KR | 10-2006-0084408 | 7/2006 |
| KR | 10-0727261 | 6/2007 |

OTHER PUBLICATIONS

Sim Sang Chul; "Semiconductor Equipment for CMP for Preventing Scratch and Scratch Preventing Method Thereof to Solidify Foreign Substances Like Solid Slurry That Is Generated During Polishing Process and Is Attached to Equipment While Using Cooling Plate"; esp@cenet; Abstract of Publication No. KR20050014350 (A); Publication Date: Feb. 7, 2005; esp@cenet database—Worldwide.

(Continued)

*Primary Examiner*—Caridad M Everhart
(74) *Attorney, Agent, or Firm*—The Law Offices of Andrew D. Fortney; Andrew D. Fortney

(57) ABSTRACT

A semiconductor device fabricating method may include forming an insulating layer on a semiconductor substrate; forming a through hole with a first depth in the insulating layer and the semiconductor substrate; forming a metal layer thereon, thereby forming a through electrode in the through hole; and exposing the through electrode by polishing the bottom surface of the semiconductor substrate.

15 Claims, 5 Drawing Sheets

OTHER PUBLICATIONS

Dong Ki Jeon and Jae Won Han; Semiconductor Device Using Predetermined Material Selected From Group Consisting of Au Ag, Pb, and AI Capable of Obtaining Stably Penetrating Electrodo From Semiconductor Device Itself and Manufacturing Method Thereof; Korean Patent Abstracts; Publication No. 100727261 B1; Publication Date: Jun. 4, 2007; Korean Intellectual Property Office, Republic of Korea.

Georg Pietsch, Michael Kerstan and Werner Blaha: Semiconductor Wafer for Improving Nano-Topology and Obtaining Enhanced Flatness: Korean Patent Abstracts: Publication No. 1020060084408 A: Publication Date: Jul. 24, 2006; Korean Intellectual Property Office, Republic of Korea.

Gi Ho Cha, Ji Jung Kang, Byseng Hun Lee and Gyeong Ok Lee; Method for Fabricating Silicon-On-Insulator Wafer; Korean Patent Abstracts: Publication No. 100327326 B1; Publication Date: Feb. 22, 2002; Korean Intellectual Property Office, Republic of Korea.

Kazuma Tanida, Mitsuo Umemoto, Yoshihiko Nemoto and Kenji Takahashi; Semiconductor Chip, Its Manufacturing Method and Semiconductor Device: Patent Abstracts of Japan; Publication No. 2005-167093; Publication Date: Jun. 23, 2005; Japanese Patent Office, Japan.

Korean Office Action dated Nov. 20, 2007 corresponding to Korean Patent Application No. 10-2006-0134783; Korean Intellectual Property Office, Republic of Korea.

\* cited by examiner

SEMICONDUCTOR DEVICE FABRICATING METHOD

The present application claims priority under 35 U.S.C. 119 and 35 U.S.C. 365 to Korean Patent Application No. 10-2006-0134783 (filed on Dec. 27, 2006), which is hereby incorporated by reference in its entirety.

BACKGROUND

Embodiments of the invention relate to a semiconductor device fabricating method.

FIG. 1 is a concept view of semiconductor devices in a SiP (System in a Package) arrangement according to fabricating method of the related art.

As shown in FIG. 1, the semiconductor devices in the SiP package according to the related art comprise an interposer 1, a first device 3, a second device 5, and a third device 7. The first to third devices 3, 5, and 7 can, for example, be independently selected from a CPU, SRAM, DRAM, Flash Memory, Logic LSI, Power IC, Control IC, Analog LSI, MM IC, CMOS RF-IC, Sensor Chip, application specific IC, and MEMS Chip, etc.

Between the first device 3 and the second device 5, and between the second device 5 and the third device 7, connecting means for connecting signals between the respective devices are formed, respectively. As one connecting means for connecting signals between the respective devices, there may be a through electrode. The through electrode is an electrode penetrating through the device or chip, and can perform a function electrically connecting the corresponding devices and the devices stacked on the upper surface thereof. Also, the through electrode can function perform a function electrically connecting the corresponding devices and the device(s) on the lower surface thereof.

As the materials for the through electrode, any metal with low resistance can be used. However, as compared to the diameter of the through electrode, the distance between an upper chip and a lower chip is about 10 to 50 μm. Considering aspect ratio (distance between chips or length of the through hole vs. diameter of the through hole), it is about 50:1 to 300:1. Therefore, it is difficult to form the through electrode stably connected from an upper area to a lower area.

A need exists for a method capable of efficiently and stably forming an elongated through electrode.

SUMMARY OF THE INVENTION

Embodiments of the invention provide a semiconductor device fabricating method capable of stably forming a through electrode connecting signals on the upper surface of a semiconductor device and signals on the lower surface of the semiconductor device, for example when the device is in a system in package (SiP) configuration.

A method according to embodiments of the invention may comprise: forming an insulating layer on a semiconductor substrate and having a contact; forming a through hole with a first depth on the insulating layer and the semiconductor substrate; forming a metal layer on the product; forming a through electrode filling the through hole by melting metal forming the metal layer through a thermal processing on the metal layer; and exposing the through electrode by polishing the bottom surface of the semiconductor substrate.

A semiconductor device fabricating method according to the embodiment comprising: forming a through hole with a first depth on a semiconductor substrate; forming a through electrode filling the through hole; and exposing the through electrode by polishing the bottom surface of the semiconductor substrate.

DETAILED DESCRIPTION OF THE EMBODIMENTS

In the description of the various embodiments, when each layer (film), an area, a pattern or structures are described to be formed "on/above" or "below/under" each layer (film), the area, the pattern or the structures, it can be understood as the case that each layer (film), an area, a pattern or structures are formed in directly contact with each layer (film), the area, the pattern or the structures and it can further be understood as the case that another layer (film), another area, another pattern or other structures are additionally formed therebetween. Therefore, the meanings should be judged according to the technical ideas and/or context of the description.

Hereinafter, embodiments of the invention will be described with reference to the accompanying drawings.

FIGS. 2 to 7 are views for explaining a semiconductor device packaging method according to various embodiments.

Figure 1:
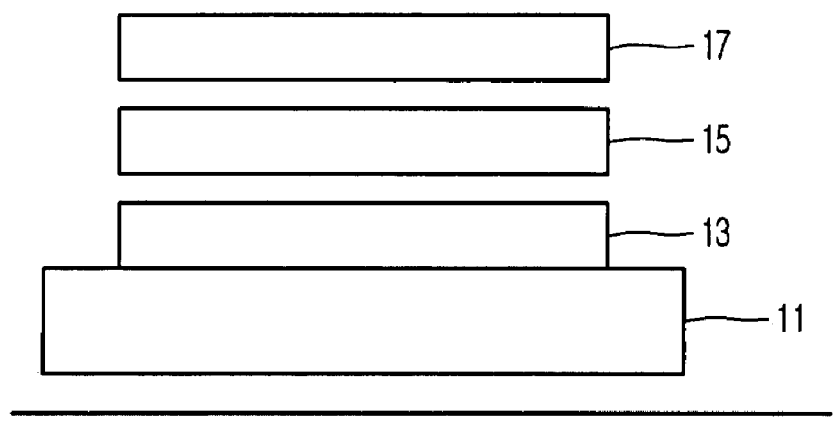
FIG. 1 is a view conceptually showing semiconductor devices in a system in a package (SiP) fabricated according to the related art.
Figure 2:
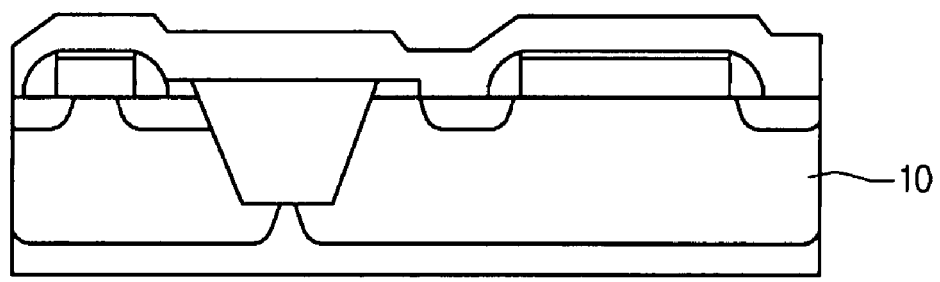
FIGS. 2 to 7 are views for explaining a method according to embodiments of the invention.
Figure 3:
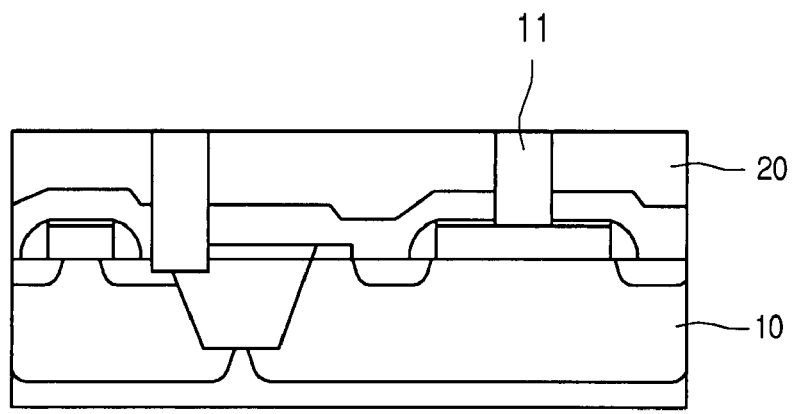

The packaging method according to embodiments of the invention may involve forming an insulating layer 20 on a semiconductor substrate 10 having transistor areas isolation areas, and contacts 11, as shown in FIGS. 2 to 7. FIG. 3 shows, by way of example, the case where the insulating layer 20 is a pre metal dielectric (PMD) layer However, with some embodiments, the insulating layer 20 is not limited to the PMD layer. The insulating layer 20 may be an intermetal dielectric (IMD) layer, and/or the insulating layer 20 may comprise a plurality of insulating layers, the bottom layer of which may contact the semiconductor substrate 10.

Figure 4:
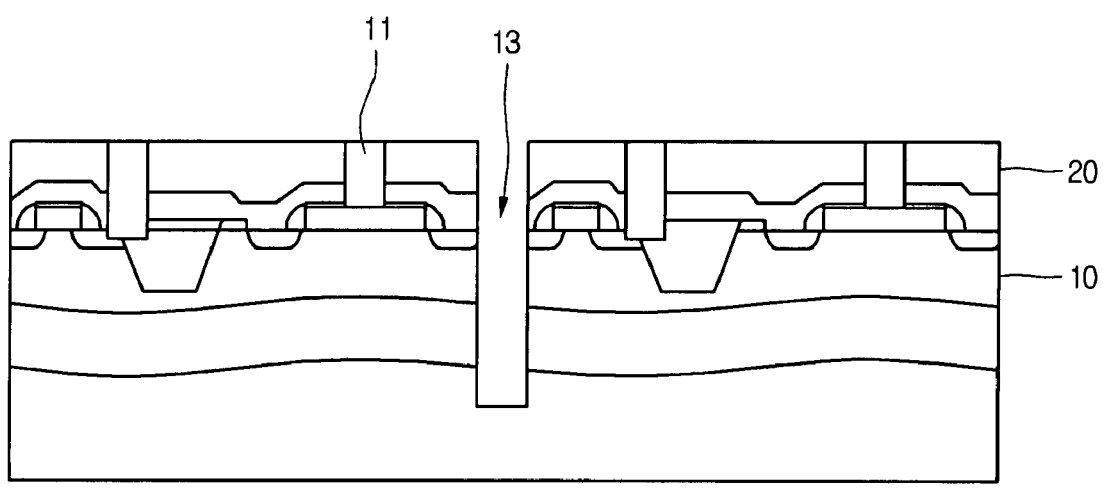

Next, as shown in FIG. 4, a through hole 13 is formed through the insulating layer 20 and through at least part of the semiconductor substrate 10. The through hole 13 penetrates through the insulating layer 20 and can be formed to a predetermined depth into the semiconductor substrate 10. In various embodiments, through hole 13 has a width of from 30 nm to 1 μm (preferably about 160 nm to about 200 mm), a depth of from about 10 to about 50 μm, and an aspect ratio of from about 50:1 to about 300:1.

Figure 5:
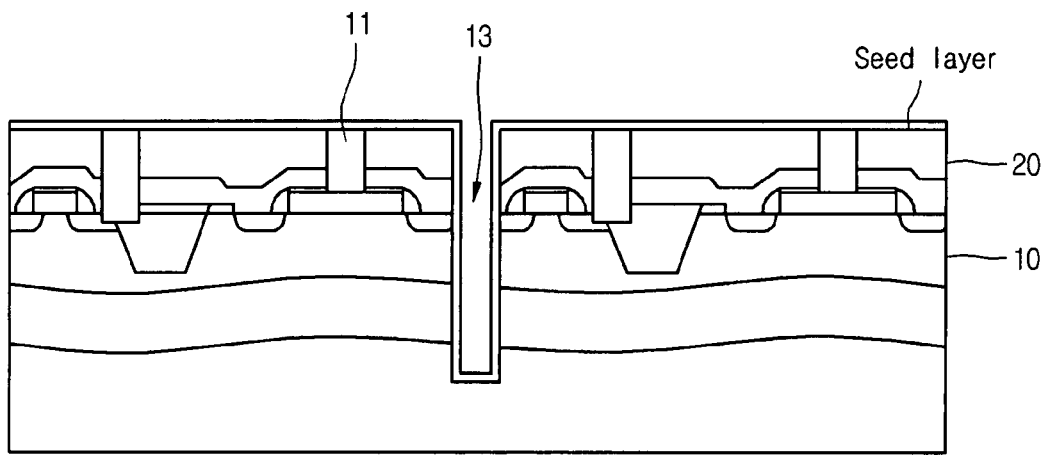
Figure 6:
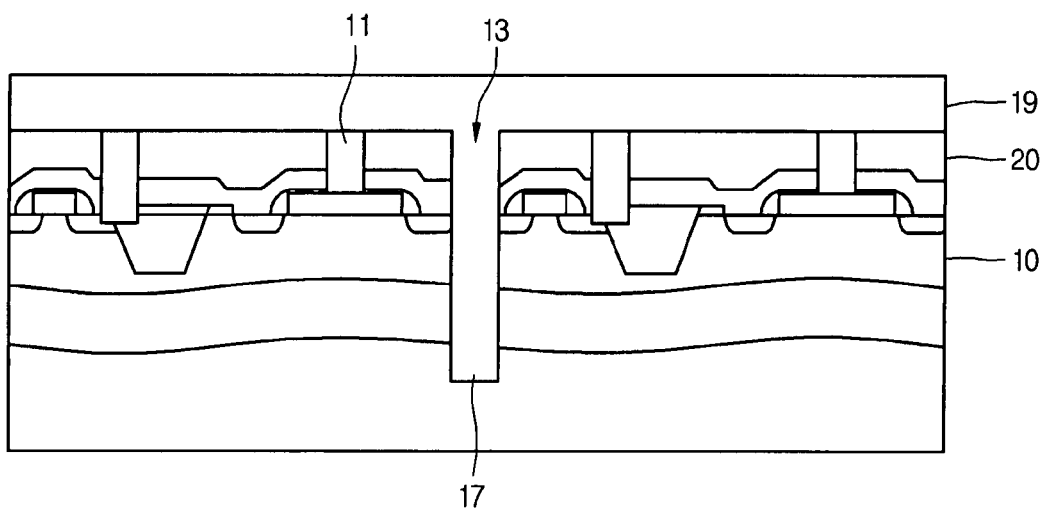

As shown in FIG. 5, a seed layer may be blanket deposited onto insulating layer 20, contacts 11, and along the sidewalls of through hole 13, generally by chemical vapor deposition and/or physical vapor deposition (e.g., sputtering). The seed layer may further include underlying barrier and/or adhesive layers. Then, as shown in FIG. 6, a metal layer 19 is then formed on the product, generally by chemical vapor deposition (CVD), physical vapor deposition (PVD) or electrodeposition.

The metal layer 19 can be formed of metal with low melting point, for example, melting point lower than 900° C. As an example, the metal layer 19 can comprise or be formed of at least one material selected from gold, silver, copper lead, tungsten, and aluminum. For example, when metal layer 19 comprises copper, it is preferably electrodeposited, the seed layer may comprise a sputtered copper or ruthenium layer, and the barrier and/or adhesive layers comprise a TaN-on-Ta or HfN-on-Hf bilayer. Alternatively, when metal layer 19 comprises tungsten, it is preferably deposited by CVD, and when metal layer 19 comprises aluminum, it is preferably deposited by PVD. In either alternative case, the seed layer is generally not present, and the barrier and/or adhesive layers generally comprise a TiN-on-Ti bilayer.

Deposition of the metal layer 19 generally forms a through electrode 17 filling the through hole 13.

According to the embodiment, the metal layer 19 is formed through deposition methods such as CVD, PVD and/or electrodeposition, and the through electrode 17 can be thus formed. Performing additional thermal processing on the product may further anneal, (re)crystallize and/or densify the metal layer 19 and/or through electrode 17. Therefore, with the semiconductor device fabricating method according to the embodiments, the through electrode 17 can be stably formed.

Also, after the step of forming the through electrode 17, the method further comprises forming a wiring layer connected to the contact(s) 11 by patterning the metal layer 19 on the insulating layer 20.

Figure 7:
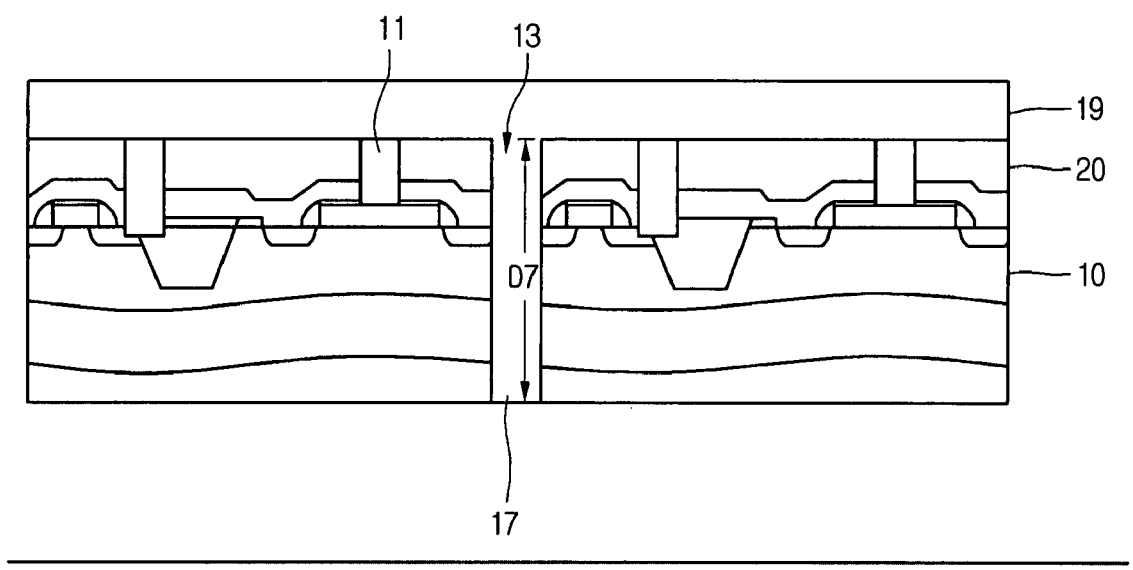

Also, after forming the through electrode 17, the bottom surface of the semiconductor substrate 10 is polished to expose the through electrode 17, as shown in FIG. 7. At this time, with the fabricating method according to embodiments of the invention, polishing the bottom surface of the semiconductor substrate 10 can be performed under liquid nitrogen ambient or by cooling the semiconductor substrate 10 with liquid nitrogen or another liquid substance that is a gas at ambient temperature but is cooled to a temperature below the boiling point of the substance at the time of polishing. Thus, in one embodiment, polishing the bottom surface of the semiconductor substrate 10 can be performed while spraying or otherwise applying liquid nitrogen to the bottom surface of the semiconductor substrate 10. Other materials having suitable boiling point and other properties for use in cooling the bottom surface of the semiconductor substrate 10 during polishing include low molecular weight hydrocarbons such as propane and butane, fluorocarbons and hydrofluorocarbons having 3 carbon atoms or less such as those having the formula $C_xH_yF_z$ (where x is generally 1 to 3, y is from 0 to 2n+1, and z is 2x+2−y), silanes such as disilane and trisilane, and inert gases such as krypton.

By polishing in the presence of a liquid coolant such as liquid nitrogen, it can both effectively cool the wafer and prevent the infiltration of pollutants or moisture into the through electrode 17 in the polishing process. Therefore, it can prevent certain damage to the through electrode 17 so that the fabricating yield can be improved.

The present method may further comprise additional pre-packaging and packing steps, such as forming a bump on the exposed through electrode 17 on the bottom surface of the wafer or semiconductor device, mounting the wafer or semiconductor device with the bumps thereon to a substrate (e.g., an interposer or another wafer or semiconductor device), enclosing the mounted device(s) in a plastic or ceramic packaging material, etc. For example, bumps can be formed on the exposed through electrode 17 by blanket depositing a bump metal onto the bottom of the semiconductor device, then patterning the bumps by photolithography and etching, or by selectively electroplating a bump metal onto the exposed through electrode 17.

The polishing process can be performed using a polishing apparatus, including a grind wheel. The grind wheel can include a diamond material and/or a resin material, for example. The polishing apparatus can also include a plurality of grind wheels.

Figure 8:
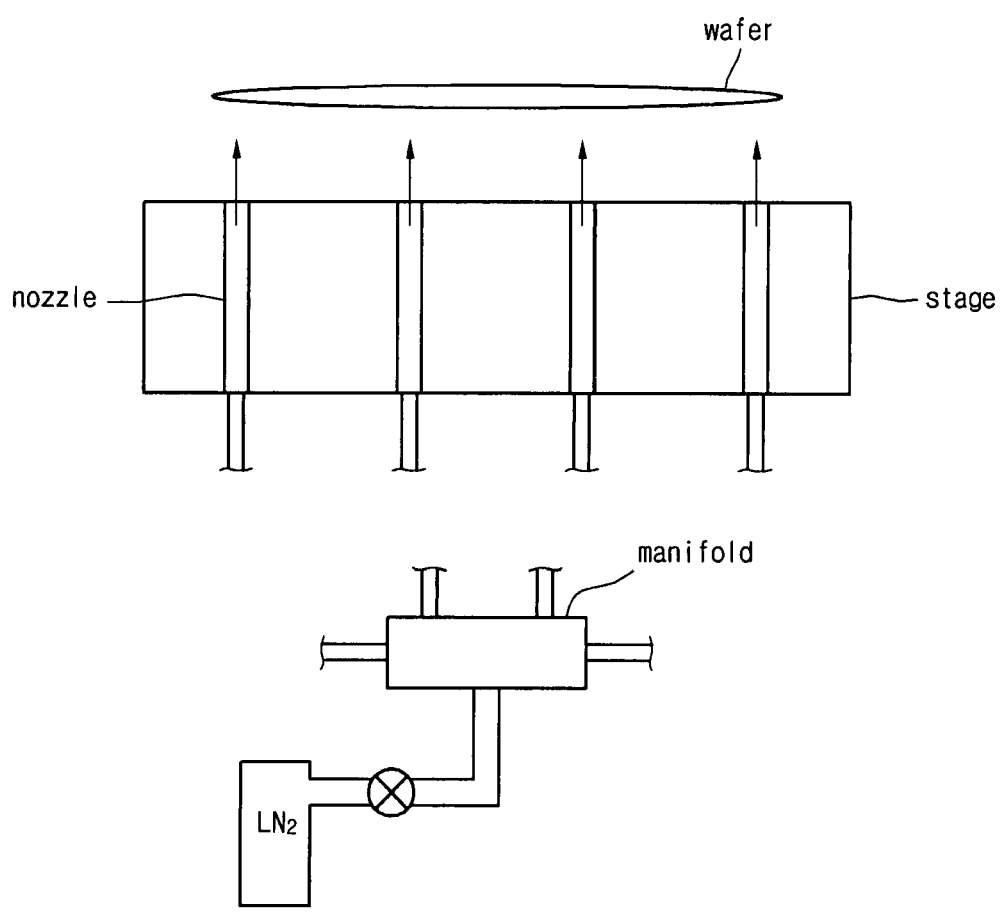
FIG. 8 is a diagram showing an embodiment of a back-grinding apparatus according to the invention.

FIG. 8 shows an exemplary apparatus including a stage on which the grinding wheel may be mounted, having nozzles therein to which liquid coolant supply tubes are connected. Liquid coolant supply tubes are provided with the liquid coolant through a manifold which receives the liquid coolant from a supply tank LN2 through a main supply line controlled by a valve that is configured to regulate the flow of the liquid coolant. Of course, variations of this design are possible. For example, the coolant liquid can be provided to the top surface of the wafer as the bottom surface is polished (e.g., undergoing backgrinding).

In the semiconductor device fabricating method according to the embodiment, one example of the polishing condition is as follows.

| Diamond Wheel Position | Z1 | Z2 |
|---|---|---|
| Air Cut | 50 | 15 |
| Thickness of Wafer (um) | 955 | 515 |
| Thickness of 1 Cut (um) | 570 | 487 |
| Thickness of 2 Cut (um) | 535 | 485 |
| Thickness of 3 Cut (um) | 515 | 485 |
| Escape Cut (um) | 3 | 7 |
| Spark Out (Revolution) | 3 | 1 |
| Spindle (rpm) | 4800 | 5500 |
| HT Gauge (1 Pass) | 0 | 0 |
| Position Offset (um) | 0 | 0 |
| Height Offset (um) | 4 | 7 |
| Z Rate of 1 Cut (0.1 um/s) | 60 ± 10 | 5 ± 2 |
| Z Rate of 2 Cut (0.1 um/s) | 30 ± 10 | 3 ± 1 |
| Z Rate of 3 Cut (0.1 um/s) | 30 ± 10 | 3 ± 1 |
| Escape Cut Rate (0.1 um/s) | 30 ± 10 | 10 ± 5 |
| Chuck Table 1 (rpm) | 200 | 150 |
| Chuck Table 2 (rpm) | 100 | 120 |
| Chuck Table 3 (rpm) | 100 | 80 |
| Liquid N2 Injection (sccm) | 300~3000 | 100~500 |

With the semiconductor device fabricating method according to embodiments of the invention, dry polishing can be made under the liquid nitrogen ambient and the infiltration of water (e.g., DI water) or Si dust, etc., into the through electrode 17 can be prevented. Therefore, device defects can be reduced, making it possible to raise the fabricating yield.

Therefore, the semiconductor device fabricating method according to the embodiment can stably form the through electrode, connecting signals between devices above and/or below the semiconductor device(s) in a system in package (SiP) configuration.

The semiconductor device fabricated by the semiconductor device fabricating method includes the semiconductor substrate 10 having transistor area(s) and an insulating layer 20 on the semiconductor substrate 10 and having contacts 11 to the transistor area(s).

With embodiments of the present invention, the insulating layer 20 is not limited to the pre metal dielectric (PMD) layer. The insulating layer 20 may be an intermetal dielectric (IMD) layer, and a plurality of insulating layers having contacts in the insulating layer 20 to the semiconductor substrate 10 may be further provided.

An exemplary semiconductor device according to embodiments of the invention includes the through electrode 17 in the through hole 13 in the insulating layer 20 and the semiconductor substrate 10. Also, the wiring layer 19 on the insulating layer 20 and connected to the contact 11 may comprise the same material as the through electrode 17.

Therefore, the semiconductor device according to embodiments of the invention can stably form a through electrode connecting signals between devices positioned on the upper surface and/or devices positioned on the lower surface of the semiconductor device in a system in package (SiP) configuration.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming a through hole with a first depth into a semiconductor substrate and through an insulating layer on the semiconductor substrate, the insulating layer having a contact therein in electrical contact with an active structure on the semiconductor substrate;
   forming a metal layer on the insulating layer and the contact, and in the through hole to form a through electrode; and
   exposing the through electrode at a bottom surface of the semiconductor substrate by polishing the bottom surface of the semiconductor substrate with a grinding wheel while cooling the semiconductor substrate with liquid nitrogen provided to the bottom surface of the semiconductor substrate through holes in the grinding wheel.

2. The method according to claim 1, wherein the grind wheel includes a diamond material and a resin material thereon.

3. The method according to claim 1, wherein the metal layer comprises a metal with a melting point lower than 900° C.

4. The method according to claim 1, wherein the metal layer is selected from the group consisting of gold, silver, lead, and aluminum.

5. The method according to claim 1, wherein forming the metal layer comprises forming a seed layer on insulating layer and the contact and in the through hole, then plating a bulk metal layer on the seed layer.

6. The method according to claim 1, further comprising, after forming the through electrode, forming a wiring layer connected to the contact by patterning the metal layer on the insulating layer.

7. The method according to claim 1, wherein the metal layer is formed by a PVD method.

8. A method comprising:
   forming a through hole with a first depth in a semiconductor substrate;
   forming a through electrode filling the through hole; and
   exposing the through electrode by polishing the bottom surface of the semiconductor substrate with a grinding wheel while cooling the semiconductor substrate with a liquid, the liquid having a boiling point of less than 10° C., provided to the bottom surface of the semiconductor substrate through holes in the grinding wheel.

9. The method according to claim 8, wherein the grind wheel includes a diamond material and a resin material thereon.

10. The method according to claim 8, wherein the liquid is liquid nitrogen.

11. The method according to claim 8, wherein the liquid is selected from the group consisting of propane, butane, fluorocarbons and hydrofluorocarbons having 3 carbon atoms or less, disilane, trisilane, and krypton.

12. The method according to claim 8, wherein the through hole has a diameter of from 0.25 to 2 μm.

13. The method according to claim 8, wherein the through hole has an aspect ratio of from 50:1 to 300:1.

14. The method according to claim 8, wherein the liquid has a boiling point of less than 0° C.

15. The method according to claim 14, wherein the liquid has a boiling point of less than −40° C.

* * * * *